(12) United States Patent
Beyne et al.

(10) Patent No.: US 10,636,739 B2
(45) Date of Patent: Apr. 28, 2020

(54) INTEGRATED CIRCUIT CHIP WITH POWER DELIVERY NETWORK ON THE BACKSIDE OF THE CHIP

(71) Applicant: IMEC VZW, Leuven (BE)

(72) Inventors: Eric Beyne, Heverlee (BE); Julien Ryckaert, Schaerbeek (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/810,488

(22) Filed: Nov. 13, 2017

(65) Prior Publication Data

US 2018/0145030 A1 May 24, 2018

(30) Foreign Application Priority Data

Nov. 21, 2016 (EP) ..................................... 16199853

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76224* (2013.01); *H01L 21/76251* (2013.01);
(Continued)

(58) Field of Classification Search
CPC ............. H01L 23/5286; H01L 23/5226; H01L 27/0922; H01L 27/1211; H01L 21/76251;
(Continued)

(56) References Cited

U.S. PATENT DOCUMENTS 5,885,862 A * 3/1999 Jao ........................ H01L 27/11
257/E21.661
9,331,062 B1 5/2016 Lane et al.
(Continued)

FOREIGN PATENT DOCUMENTS

EP          2913847 A1    9/2015
EP          3035369 A1    6/2016
WO     WO 2016/176046 A1   11/2016

OTHER PUBLICATIONS

Extended European Search Report dated Apr. 17, 2018 in European Application No. 17196921.5.

*Primary Examiner* — Sitaramarao S Yechuri
(74) *Attorney, Agent, or Firm* — Knobbe Martens Olson & Bear LLP

(57) ABSTRACT

An integrated circuit (IC) chip having power and ground rails incorporated in the front end of line (FEOL) is disclosed. In one aspect, these power and ground rails are at the same level as the active devices and are therefore buried deep in the IC, as seen from the front of the chip. The connection from the buried interconnects to the source and drain areas is established by local interconnects. These local interconnects are not part of the back end of line, but they are for the most part embedded in a pre-metal dielectric layer onto which the BEOL is produced. In a further aspect, a power delivery network (PDN) of the IC is located in its entirety on the backside of the chip. The PDN is connected to the buried interconnects through suitable connections, for example metal-filled through-semiconductor vias or through silicon vias.

20 Claims, 14 Drawing Sheets

(51) Int. Cl.
*H01L 23/48* (2006.01)
*H01L 23/535* (2006.01)
*H01L 21/762* (2006.01)
*H01L 27/092* (2006.01)
*H01L 21/8238* (2006.01)
*H01L 21/84* (2006.01)
*H01L 23/522* (2006.01)
*H01L 27/12* (2006.01)

(52) U.S. Cl.
CPC .. *H01L 21/76895* (2013.01); *H01L 21/76898* (2013.01); *H01L 21/823821* (2013.01); *H01L 21/823871* (2013.01); *H01L 21/845* (2013.01); *H01L 23/48* (2013.01); *H01L 23/481* (2013.01); *H01L 23/5226* (2013.01); *H01L 23/5283* (2013.01); *H01L 23/535* (2013.01); *H01L 27/0922* (2013.01); *H01L 27/0924* (2013.01); *H01L 27/1211* (2013.01)

(58) Field of Classification Search
CPC ..... H01L 21/823821; H01L 21/823871; H01L 21/845
See application file for complete search history.

(56) References Cited

U.S. PATENT DOCUMENTS

| | | |
|---|---|---|
| 2002/0020862 A1 | 2/2002 | Livengood et al. |
| 2003/0207523 A1 | 11/2003 | Liu et al. |
| 2008/0203450 A1* | 8/2008 | Naruse ............ H01L 21/76807 257/290 |
| 2009/0065904 A1* | 3/2009 | Wang ................ H01L 21/76898 257/621 |
| 2010/0155940 A1* | 6/2010 | Kawashita .......... H01L 21/6835 257/737 |
| 2010/0252934 A1* | 10/2010 | Law ...................... H01L 23/481 257/774 |
| 2011/0241217 A1 | 10/2011 | Chang et al. |
| 2012/0292777 A1 | 11/2012 | Lotz |
| 2013/0264676 A1* | 10/2013 | Yang .................. H01L 23/5226 257/508 |
| 2014/0008757 A1 | 1/2014 | Ramachandran et al. |
| 2015/0187642 A1 | 7/2015 | Batra et al. |
| 2015/0332966 A1* | 11/2015 | Maling ................ H01L 23/481 257/762 |
| 2016/0233298 A1 | 8/2016 | Webb et al. |

* cited by examiner

INTEGRATED CIRCUIT CHIP WITH POWER DELIVERY NETWORK ON THE BACKSIDE OF THE CHIP

CROSS-REFERENCE TO RELATED APPLICATIONS

This application claims foreign priority to European Patent Application No. 16199853.9, filed Nov. 21, 2016, the contents of which is incorporated by reference herein in its entirety.

BACKGROUND

Technological Field

The disclosed technology is related to integrated circuit chips, hereafter abbreviated to ICs or IC chips, in particular to the aspect of the delivery of power to the active devices on the chip.

Description of the Related Technology

Semiconductor processing for the fabrication of integrated circuit chips continues to evolve towards increasing device-density: higher numbers of active devices (mainly transistors) of ever decreasing device dimensions are placed on a given surface of semiconductor material. This has put a strain on the design and fabrication of the interconnects between the front end of line of the IC, consisting mainly of the active devices, and the contact terminals of the IC. Traditionally, all of these interconnects are incorporated in the back end of line of the IC: a stack of metallization layers on top of the front end and including layers of circuitry connected by vertical via connections. The power delivery network or PDN is specifically formed by conductors and vias connected to VDD/VSS terminals of the chip, for delivering power to the individual devices in the front end. The integration of this power delivery network in the back end of line has become particularly challenging because of the abovenamed increase in the device density.

One known solution to this problem consists in the production of the majority of layers of the power delivery network on the back side of the IC instead of on the front side. These layers are thus not formed on top of the front end of line, but on the opposite side of the IC, i.e., on the backside of the semiconductor substrate onto which the active devices have been built.

U.S. Patent Publication No. 2002/0020862 shows an example of such a backside PDN. As in other similar publications, the problem with the designs shown in this document is that in order to reach the individual active devices in the front end of line, the backside power planes are either directly connected to source and drain areas of these active devices, or to the M1 layer in the back end of line, or to both. Using M1 for the power supply still means that an important part of the back end of line is used for the power delivery. Directly connecting the source and drain areas from the back is difficult in view of the continuous scaling down of active devices. Source and drain areas in planar devices are now dimensioned in the order of nanometers, which makes it extremely difficult to produce a substrate via to contact such source/drain areas from the back of the substrate, as shown in U.S. Patent Publication No. 2002/0020862. For non-planar active devices, such as finFET transistors, directly contacting the source/drain from the back by a substrate via is even more difficult.

SUMMARY OF CERTAIN INVENTIVE ASPECTS

The disclosed technology is related to an IC wherein the power delivery network is fully separated from the back end of line, without requiring directly contacting source and drain areas from the back side. The characteristics of such a device and to methods of its fabrication are described with reference to the following embodiments.

The disclosed technology is thus firstly related to an integrated circuit (IC) chip including:
a front end of line (FEOL) portion including active devices,
a pre-metal dielectric layer on top of the front end of line portion,
a back end of line (BEOL) portion on top of the pre-metal dielectric layer,
one or more power terminals and one or more reference terminals, and
a power delivery network (PDN) connecting a plurality of the active devices to the terminals,
wherein:
the front end of line portion includes a plurality of interconnect rails, including at least one power rail and at least one reference rail,
the plurality of active devices are connected to the at least one power and reference rail through local interconnects which are at least partially embedded in the pre-metal dielectric layer,
the power delivery network is entirely located underneath the front end of line portion, and the power delivery network connects the power and reference rails respectively to the power and reference terminals.

Both the active devices and the interconnect rails are part of the front end of line portion of the IC, and are therefore substantially at the same level (i.e., interconnect rails are adjacent to active devices). A local interconnect in an IC of the disclosed technology is therefore a lateral connection between an active device (for example, a source or drain area of a transistor) and an interconnect rail. The local interconnect is located at the front side of the IC, where it is at least partially embedded in the pre-metal dielectric layer between the FEOL and the BEOL. The BEOL portion defines the front side of the integrated circuit. Therefore, the PDN and the power and reference terminals are located on the backside of the IC according to the disclosed technology.

According to an embodiment, the FEOL portion includes a semiconductor substrate and the interconnect rails are at least partially buried in the semiconductor substrate. In the latter case, the PDN may be connected to the buried interconnect rails by way of metal-filled TSVs (Through-Semiconductor Vias) through the semiconductor substrate or by way of damascene-type contacts.

According to another embodiment, the FEOL portion comprises a dielectric layer (55) that is itself formed on a semiconductor substrate, wherein the interconnect rails are at least partially embedded in the dielectric layer, and wherein the PDN is connected to the buried interconnect rails by way of metal-filled TSVs (Through-Semiconductor Vias) through the dielectric layer or by way of damascene-type contacts.

According to an embodiment, a plurality of parallel power rails and reference rails are alternately arranged and active devices are located in between pairs of adjacent power and reference rails. In the latter embodiment, the active devices may include finFET transistors which include fins arranged essentially parallel to the interconnect rails, each of the finFET transistors including source and drain areas and a gate electrode, wherein at least some of the source and drain areas of the transistors are connected to the power and reference rails through the local interconnects.

According to an embodiment, a signal path is routed through the PDN, between the BEOL portion and a signal terminal. In the latter embodiment, the signal path may include a further local interconnect at least partially embedded in the pre-metal dielectric layer and connected between the BEOL portion and a portion of an interconnect rail that is isolated from the rest of the rail. Further in the latter embodiment, the front end of line portion may further include at least one interconnect rail that is:

not connected to the power and reference terminals, and a part of the signal path, and therefore referred to as a "signal rail," and wherein the signal rail is connected to the BEOL portion, via one or more additional local interconnects which are at least partially embedded in the pre-metal dielectric layer.

The disclosed technology also includes a method for producing an integrated circuit chip, including the consecutive steps of:

Producing the FEOL portion, the pre-metal dielectric and the BEOL portion on a first substrate, the FEOL portion comprising a plurality of interconnect rails connected to active devices in the FEOL portion through local interconnects at least partially embedded in the pre-metal dielectric, Bonding the first substrate to an auxiliary substrate with the BEOL portion attached to the auxiliary substrate, Thinning the first substrate, Producing contacts from the back of the thinned substrate, to the interconnect rails in the FEOL portion, Producing the PDN network on the back of the thinned substrate.

The contacts may be produced by etching Trough Semiconductor Via openings through the thinned substrate and filling these via openings with conductive material. According to an embodiment, the contacts are produced by damascene processing.

According to an embodiment, thinning of the substrate is done until reaching the back of the interconnect rails.

According to an embodiment, the FEOL portion includes a dielectric layer that is itself part of the first semiconductor substrate, and the step of thinning continues at least until reaching the dielectric layer.

BRIEF DESCRIPTION OF THE DRAWINGS

The figures are used only for illustrating the disclosed technology. They are not drawn to scale nor do the various layers and components shown in the figures have realistic relative dimensions.

In FIGS. 1 and 2, buried interconnect rails are indicated by a different type of hatching (//) than local interconnects and local signal contacts (\\).

DETAILED DESCRIPTION OF CERTAIN ILLUSTRATIVE EMBODIMENTS

In an IC according to the disclosed technology, power and ground rails are incorporated in the front end of line (FEOL). These power and ground rails are at the same level as the active devices and are therefore buried deep in the IC, as seen from the front of the chip. For this reason, these power and ground rails are referred to as "buried interconnects" throughout this disclosure. The connection from the buried interconnects to the source and drain areas is established by so-called "local interconnects." These local interconnects are not part of the back end of line, but they are for the most part embedded in a pre-metal dielectric layer onto which the BEOL is produced. Example methods for producing such buried interconnect rails and local interconnects will be described later in this description. Further according to the disclosed technology, the power delivery network of the IC is located in its entirety on the backside of the chip. The PDN is connected to the buried interconnects through suitable connections, for example metal-filled vias of the type known as "through-semiconductor vias" or "through silicon vias" (TSV). These characteristics of the IC make it possible to produce the entire PDN on the backside of the chip, without requiring a connection to the M1 level of the BEOL. Also, direct connections from the backside to the source/drain regions are not required.

Figure 1:
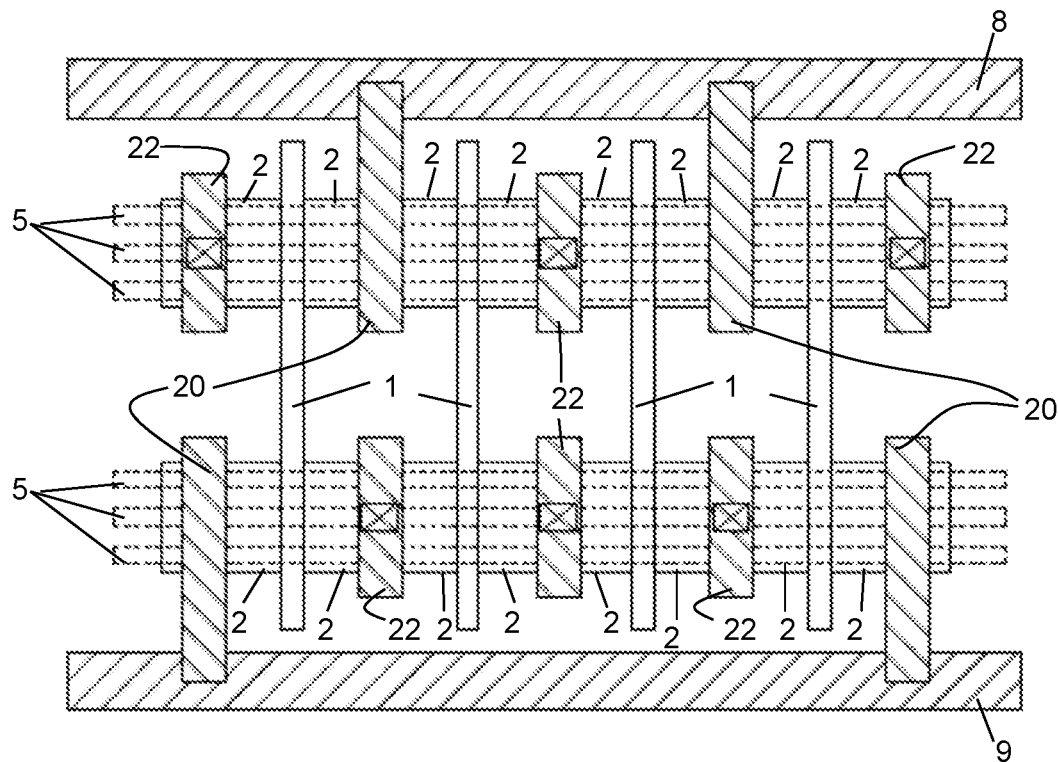
FIG. 1 is a plane view of a CMOS layout of finFET devices according to the disclosed technology.
Figure 2:
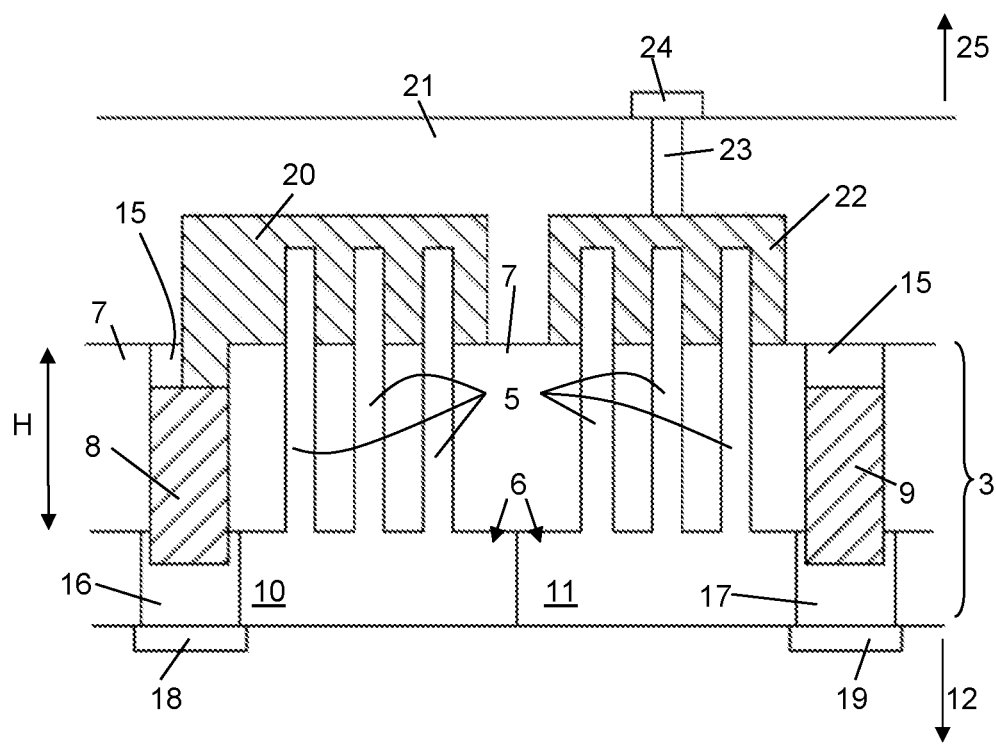
FIG. 2 is a sectioned view of the layout of FIG. 1, illustrating the buried interconnect rails.

The disclosed technology will be described in more detail for the case of a CMOS layout of finFET transistors. The disclosed technology, however, is not limited to this particular application field. FIG. 1 shows a plane view of a typical CMOS layout including four gate strips 1, with source/drain areas 2 on either side of the gate strips. The source/drain areas are shown as regions delimited by black lines for the sake of indicating the general location of these areas. These black lines, however, do not indicate a physical boundary delimiting the actual source and drain areas, which are mostly confined in practice to the top area of the fins 5 or to a contact region consisting of epitaxially grown conductive material on top of the fins (this may depend on whether the S/D areas are part of nFET or pFET transistors). The upper row of S/D areas 2 are p-type doped areas in a n-type doped region 10 of a semiconductor substrate, forming pMOS transistors, while the lower row of S/D areas 2 are n-type doped areas in a p-type doped region 11 of the substrate, forming nMOS transistors. The S/D areas 2 are formed in two groups of three fins 5 each, one group for the pMOS transistors and one group for the nMOS transistors. A side view is shown in FIG. 2, along the plane AA', indicated in FIG. 1. The fins 5 are visible in this view. The fins extend out of a semiconductor substrate 6 and are embedded up to a height H in an oxide layer 7, the active part of the fins extending away from the upper surface of the oxide layer 7. Two interconnect rails 8/9 are arranged parallel to the fins. The upper rail 8 in FIG. 1 is connected to VDD, the lower rail 9 is connected to ground, or more generally to a reference voltage VSS.

As seen in FIG. 2, these rails are buried in the semiconductor substrate 6 and in the oxide layer 7. The interconnect rails 8 and 9 are thus part of the front end of line portion of the IC. This FEOL portion is indicated by numeral 3 in FIG. 2, but it can be said to include also the active part of the fins that extends above the oxide layer 7. A dielectric capping layer 15 covers the top of the buried interconnect rails 8/9. At the back of the substrate 6, the buried interconnect rails are contacted by metal-filled vias 16/17 through the substrate 6. The vias 16 are shown in FIG. 2 but they are not necessarily located in plane AA'. Preferably multiple vias 16/17 are formed in contact with each of the buried rails 8/9. The metal-filled vias 16/17 are connected to conductors 18/19 which form the first level of a power delivery network 12 that is not shown in further detail in FIG. 2, and that is configured to connect the buried interconnects 8/9 to power and ground terminals on the backside of the IC. The structure of the PDN 12 can be made according to known practice (see further examples described below). Depending on the exact function of transistor arrangement in FIG. 1, a number of the S/D areas 2 will be connected to power and ground and/or to signal lines in the back end of line. The connection to the power and ground rails is established through so-called local interconnects 20, one of which is illustrated in FIG. 2. The local interconnect 20 is a metal area placed transversally to the fins 5 and contacting the top of a buried interconnect rail and embedded in a dielectric layer 21, known as the pre-metal dielectric, i.e., this is the layer known in the art on top of which the back end of line layers are built. The local interconnect 20 is thus a lateral connection between a source or drain area 2 and a buried rail 8 or 9. The connection is lateral because the S/D areas and the buried rails are substantially on the same level (both part of the FEOL).

In some embodiments, each of the source and drain areas 2 that is not connected to one of the buried rails is provided with a local signal contact 22, transversal to the fins. These local contacts are connected to the back end of line by via connections 23 through the pre-metal dielectric 21, as known in the art, which are connected to conductors 24 in the actual BEOL stack 25, also not shown in detail in FIG. 2.

It is clear that the BEOL stack 25 in an integrated circuit according to the disclosed technology is fully separated from the PDN 12, thereby increasing the routing resources in the BEOL compared to existing designs, including the designs which have the majority of the PDN, but not the totality, on the backside of the chip. Moving the totality of the PDN to the backside is not a self-evident matter compared to the latter designs which always require at least one PDN level above the transistors. The disclosed technology solves this problem by providing the buried interconnect rails 8/9 and the local interconnects 20.

Variations to the above-described embodiment are possible without departing from the scope of the disclosed technology. The interconnect rails 8/9 could be buried deeper or less deep into the substrate 6 and oxide layer 7 compared to the case shown in FIG. 2. The buried interconnects 8/9 may be separated from the bulk substrate 6 by a dielectric liner. However, when the VDD rail 8 is embedded in an n-well region 10 and the VSS rail 9 is embedded in a p-well region 11, which is normally the case in a CMOS layout, this isolation liner may be omitted. While FIGS. 1 and 2 show finFET transistors of the bulk type, with fins 5 obtained by etching in a semiconductor substrate 6, the disclosed technology is equally applicable to finFETs produced on an insulator layer, such as on a buried oxide layer of a so-called SOI wafer (silicon-on-insulator). In the latter case, the interconnect rails 8/9 may be buried in the insulator layer and may be contacted from the back through TSVs or similar contacts, in the same manner as shown in the figures. The disclosed technology is also not limited to finFET devices, but is applicable also to planar devices, be it planar bulk transistors or planar transistors produced on an SOI type substrate. Buried power and ground rails 8 and 9 need not necessarily run along parallel tracks. The power and ground rails may be interrupted or portions of a rail may be isolated from the rest of the rail, for example for routing a signal path through the PDN, as explained in more detail further in this description.

Figure 3A:
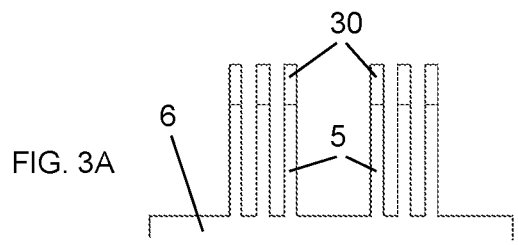
FIGS. 3A through 3M illustrate process steps for the production of a buried contact rail in an IC according to the disclosed technology.
Figure 3B:
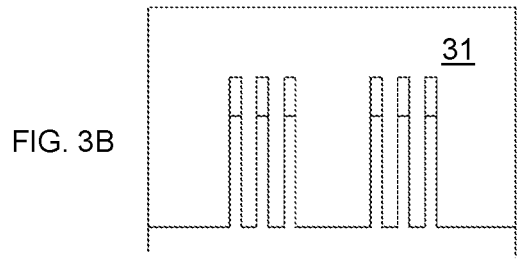
Figure 3C:
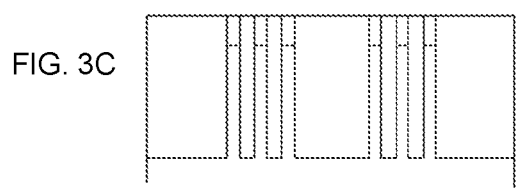
Figure 3D:
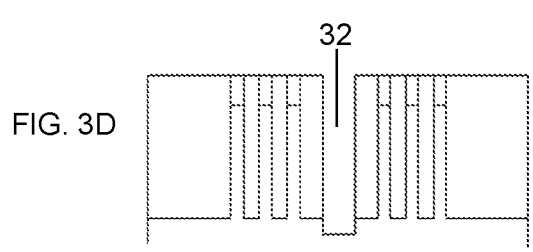
Figure 3E:
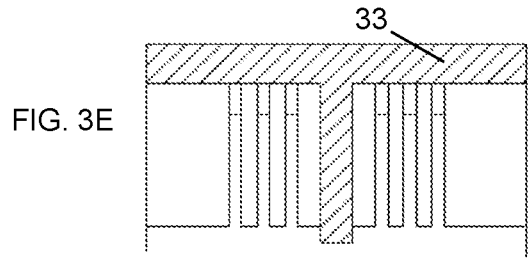
Figure 3F:
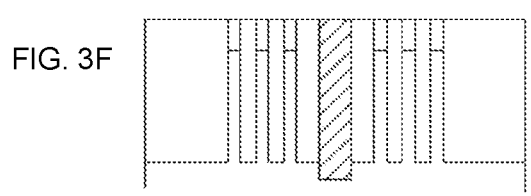
Figure 3G:
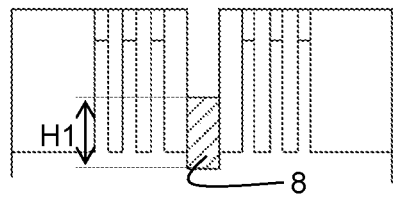
Figure 3H:
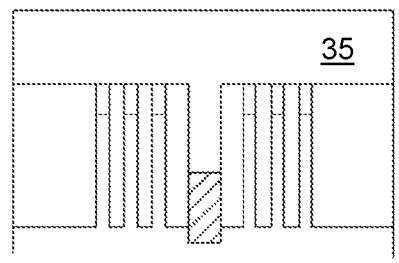
Figure 3I:
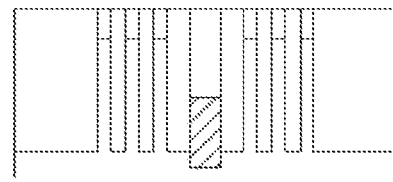
Figure 3J:
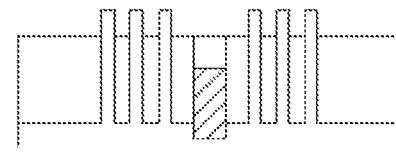
Figure 3K:
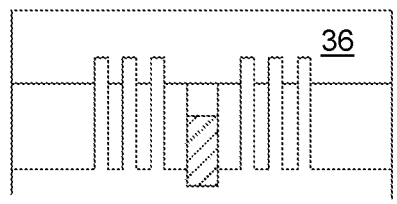
Figure 3L:
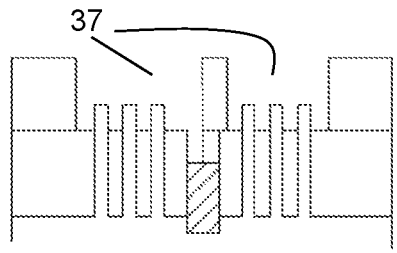
Figure 3M:
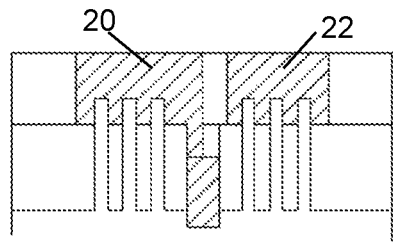

FIGS. 3A through 3J illustrate a number of process steps for producing a buried interconnect rail between two rows of fins in a bulk finFET IC, including the formation of a local interconnect. FIG. 3A shows the situation after fins 5 have been etched in a silicon substrate 6. The etch mask 30 is still present on top of the fins. Deposition of an STI (Shallow Trench Isolation) oxide 31 and planarization of the oxide are then performed (see FIGS. 3B and 3C). By litho and etch, a deep trench 32 is then produced between the fins (see FIG. 3D). This trench is filled with a conductive material 33 (see FIG. 3E). This may be very highly doped silicon, or a metal such as W or Ru. Planarization of the conductive material is performed (see FIG. 3F), followed by etching back the material in the trench down to a given depth, leaving a height H1 of conductive material in the trench (see FIG. 3G), thus forming a conductive rail 8 of this height H1. STI oxide 35 is then deposited again (see FIG. 3H), filling the trench above the rail, and planarized (see FIG. 3I). Then a top portion of the fins is exposed by etching back the STI oxide (see FIG. 3J). This is followed by the gate formation which is not shown in the drawings, and which may be done by a known technique, for example a replacement gate technique. The gates are formed perpendicularly to the fins 5. FIG. 3K shows a cut along a plane that is situated between two gates. A dielectric layer 36 separates each pair of adjacent gates. Openings 37 are etched by a litho+etch step (see FIG. 3L), and subsequently filled with metal (see FIG. 3M), to form the local interconnects 20 to the buried rail 8 and the local contacts 22 in a single step.

Figure 4A:
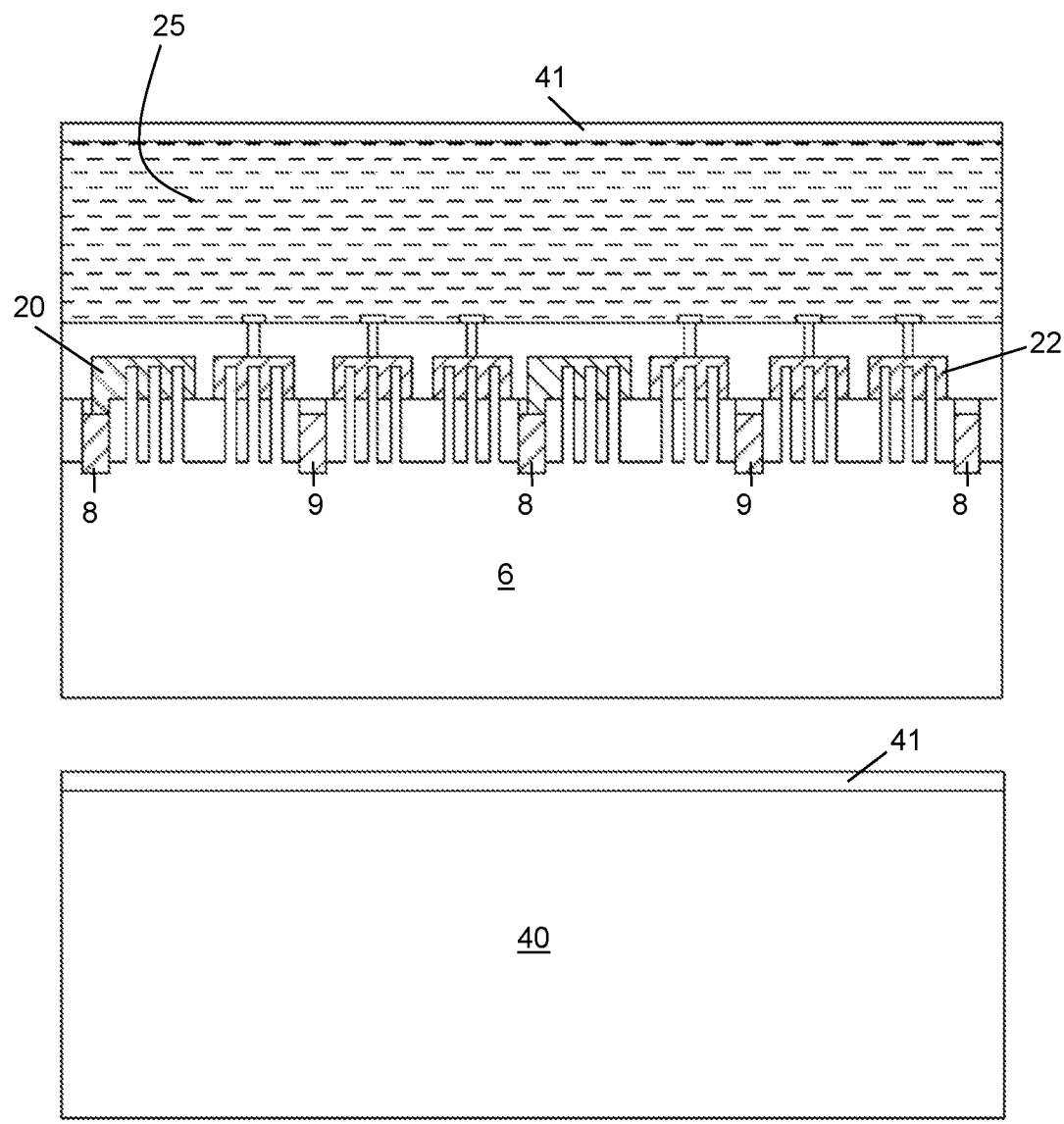
FIGS. 4A through 4I illustrate process steps for the production of an integrated circuit according to an embodiment of the disclosed technology based on bulk type finFET transistors.
Figure 4B:
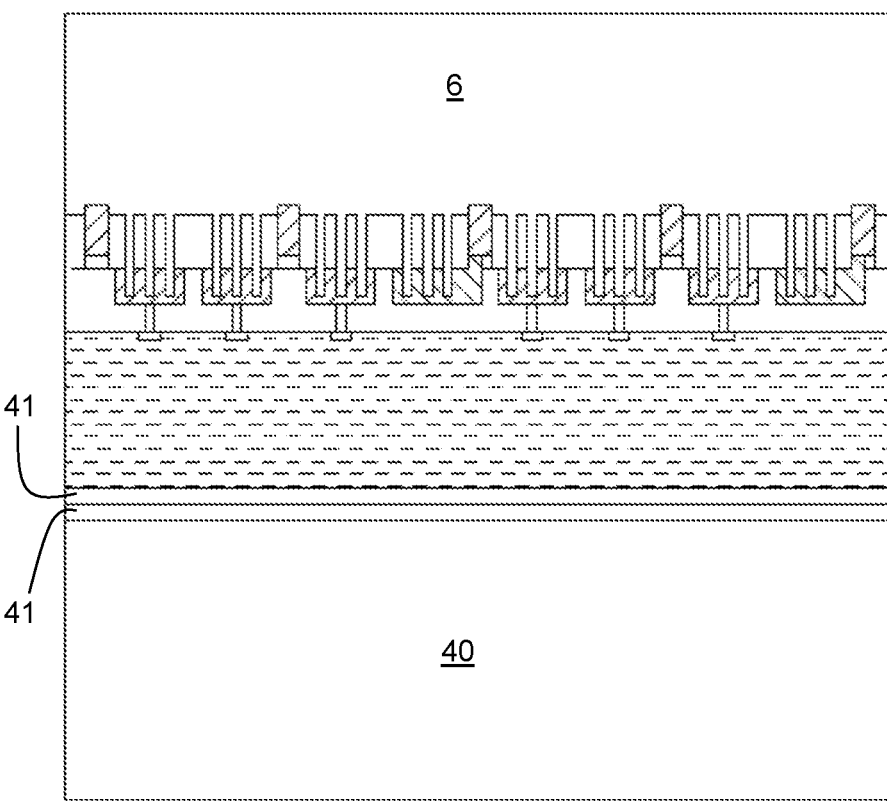

FIGS. 4A through 4I illustrate method steps for producing an IC according to the disclosed technology. A device wafer is first fabricated by FEOL and BEOL processing on a semiconductor wafer, the FEOL process including the above-described steps for producing the buried and local interconnects 8/9 and 20/22. FIG. 4A shows the resulting device wafer including a semiconductor substrate 6 with several rows of bulk type finFETs, i.e., finFETs having fins 5 produced from the semiconductor material of the substrate, and provided with buried interconnects 8 and 9 which are alternately to be connected to VDD and VSS, and local interconnects 20 as described above. Gate strips (not shown) are arranged transversal to the fins. The BEOL stack 25 is illustrated in a schematic manner, without detailing the interconnections. This device wafer is first bonded to an auxiliary substrate 40. Both substrates are preferably provided with a bonding layer 41. These may be silicon oxide layers or SiCN layers, or any other layers applicable in the direct bonding technology applied in state of the art packaging techniques. Bonding of the device wafer to the auxiliary substrate takes place by such known direct bonding techniques, thus obtaining a wafer assembly as shown in FIG. 4B.

Figure 4C:
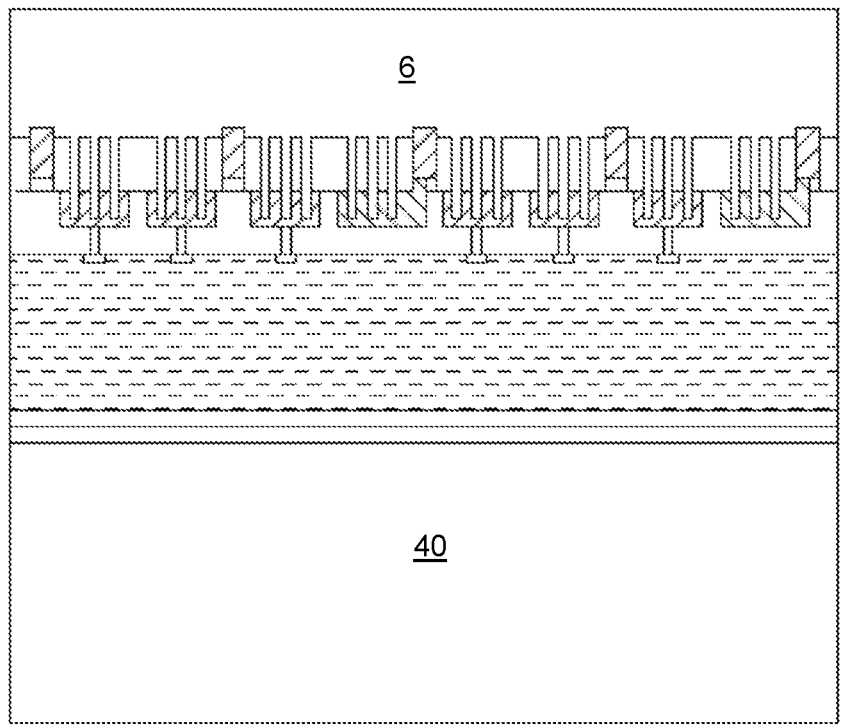
Figure 4D:
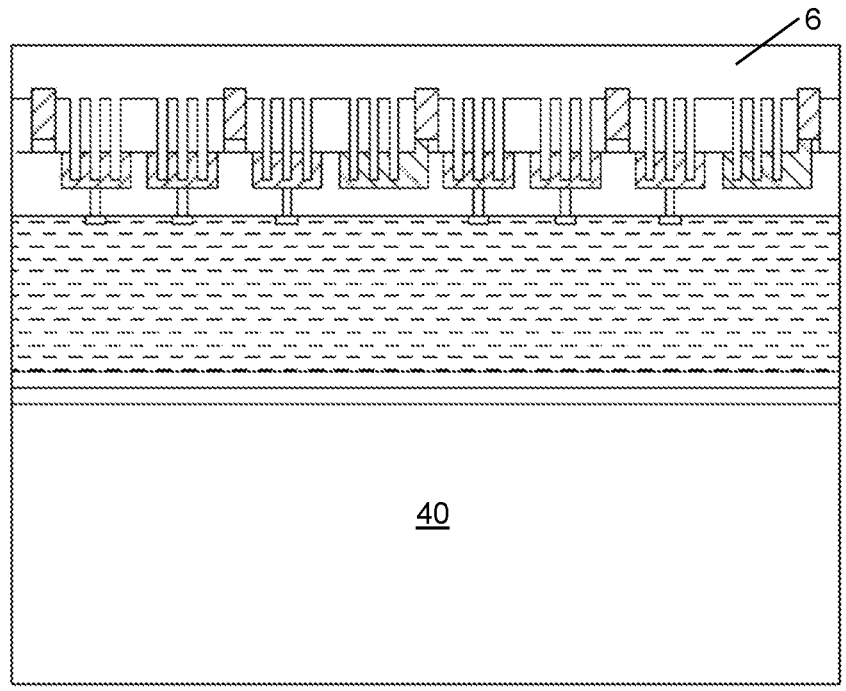
Figure 4E:
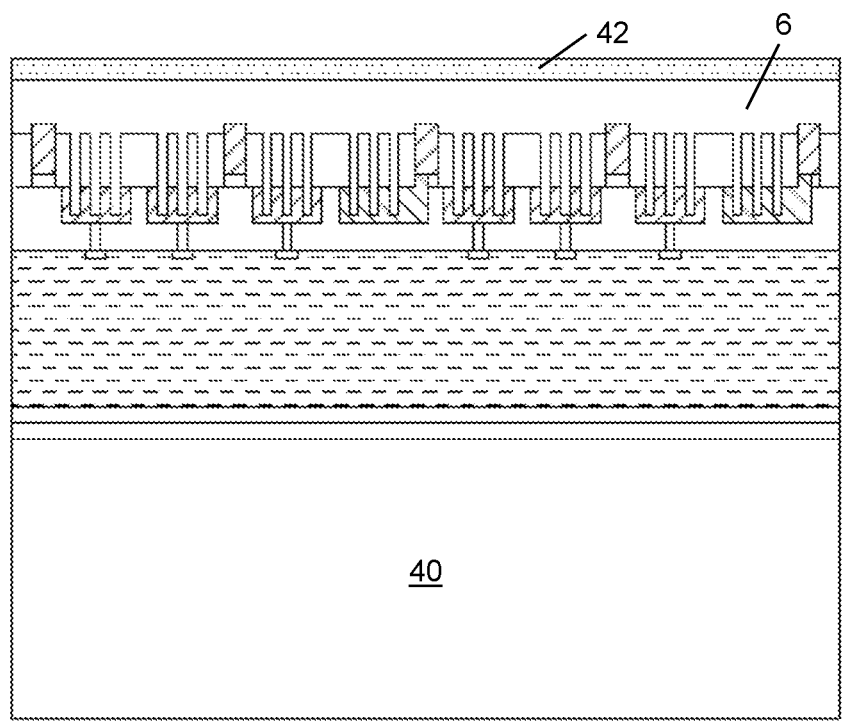
Figure 4F:
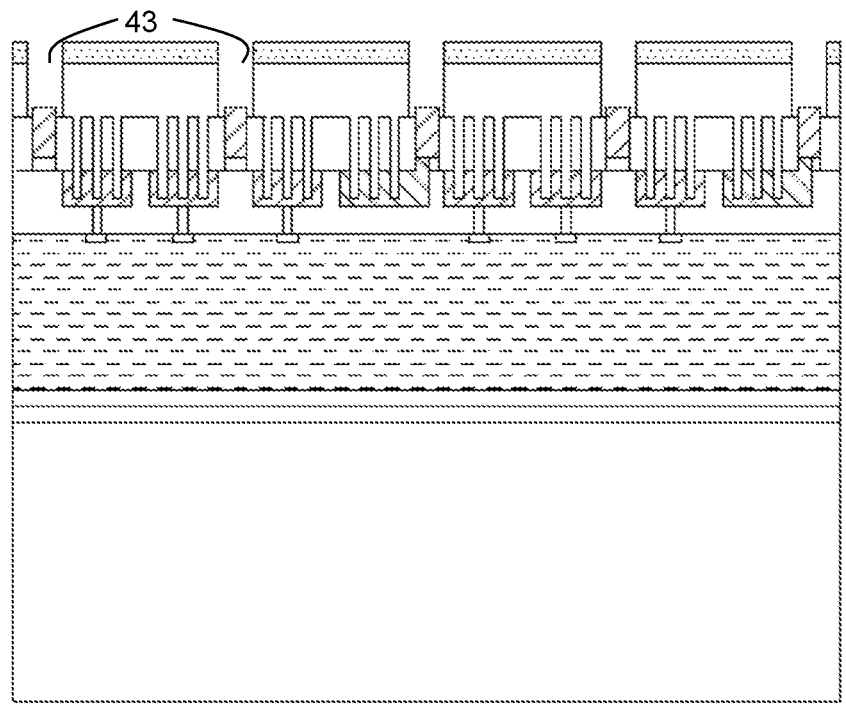
Figure 4G:
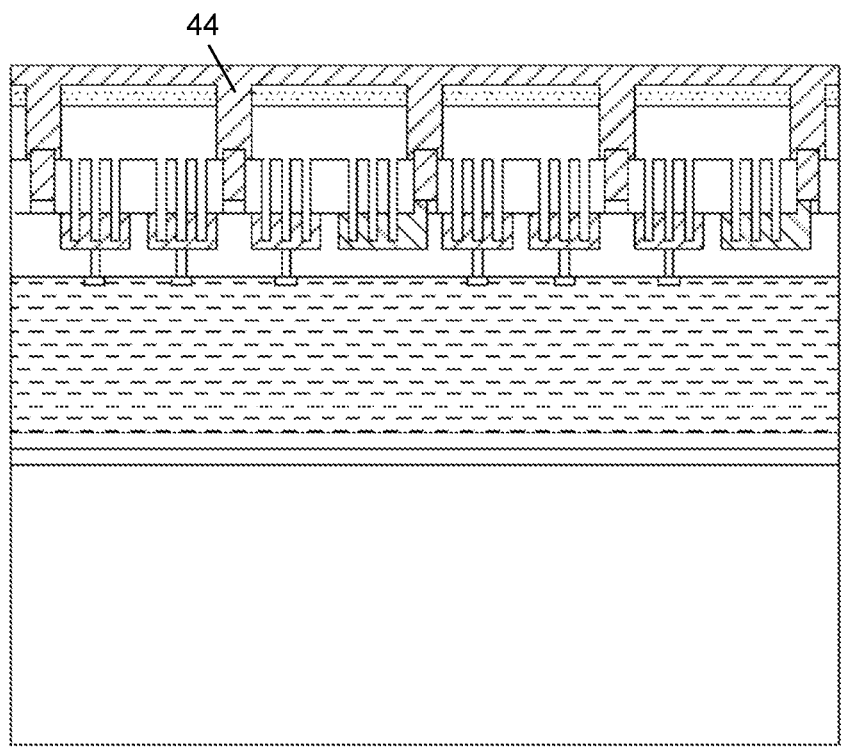
Figure 4H:
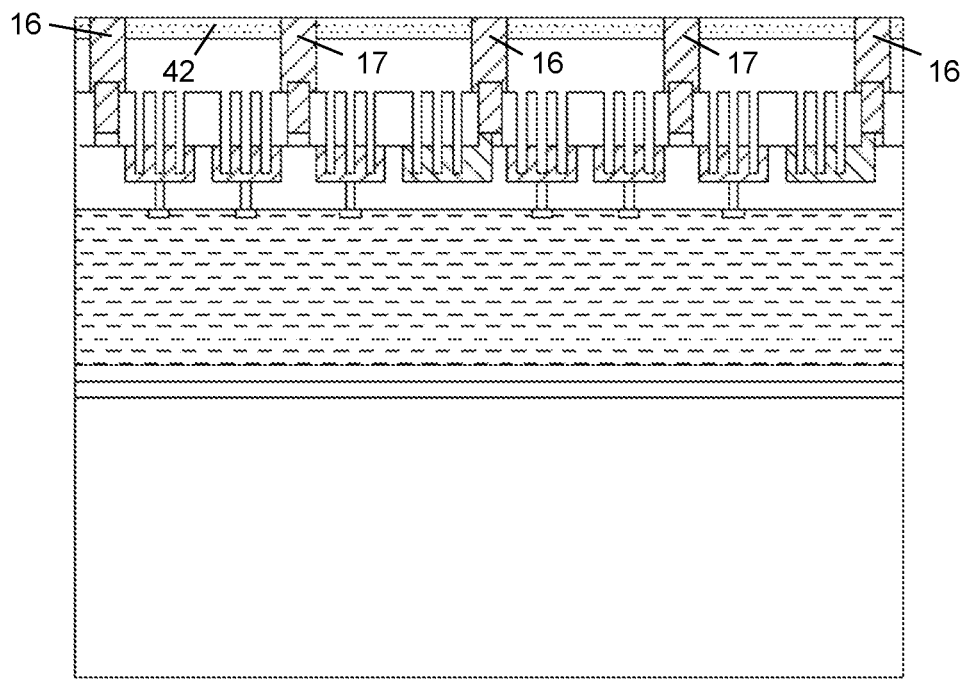

The semiconductor substrate 6 of the device wafer is subsequently thinned using regular grinding and/or wet or dry etching techniques (see FIG. 4C). The remaining semiconductor thickness is preferably in the order of a few micrometers, for example 5 µm. Further reduction of the thickness is then performed, down to a semiconductor thickness of about 1 µm (see FIG. 4D). According to an embodiment, this may be achieved by incorporating in the device wafer a doped layer which can act as an etch stop layer. Such a doped etch stop layer is known for example from the processing of backside illuminated imagers and MEMS (micro electromechanical system) devices.

A highly selective wet etching step stopping on the doped layer is then applied for thinning the semiconductor wafer to the required thickness of about 1 µm. A passivation layer 42 is then deposited in order to avoid any damage or contamination of the finFET devices (see FIG. 4E). The passivation layer may be formed of SiON, SiCN or SICO for example. The thickness of the passivation layer 42 may, for example, be about 50 nm. Following this, TSV openings 43 are etched through the passivation layer and remaining substrate material (see FIG. 4F), until reaching the buried interconnect rails 8/9. In some embodiments a plurality of TSV openings 43 are formed for each rail 8/9 that is connected to power or ground. In the embodiment shown in the drawings, the TSV openings have a rectangular cross-section as seen in a plane that is parallel to the top of the rails 8/9, with the width of the cross-section larger than the width of the buried rails 8/9. Etching of the openings continues over a small distance when the top of the buried rails is reached, so that the opening partly envelops the top of the buried rails. Alternatively, the TSV openings 43 may have a circular cross-section, with a diameter that is smaller or equal to the width of the buried rails 8/9. For example, the openings may have a diameter of about 100 nm and a depth of 1050 nm (50 nm passivation layer and 1000 nm substrate). TSV lithography and etch techniques as known in the art may be applied for producing the TSV openings 43.

Figure 4I:
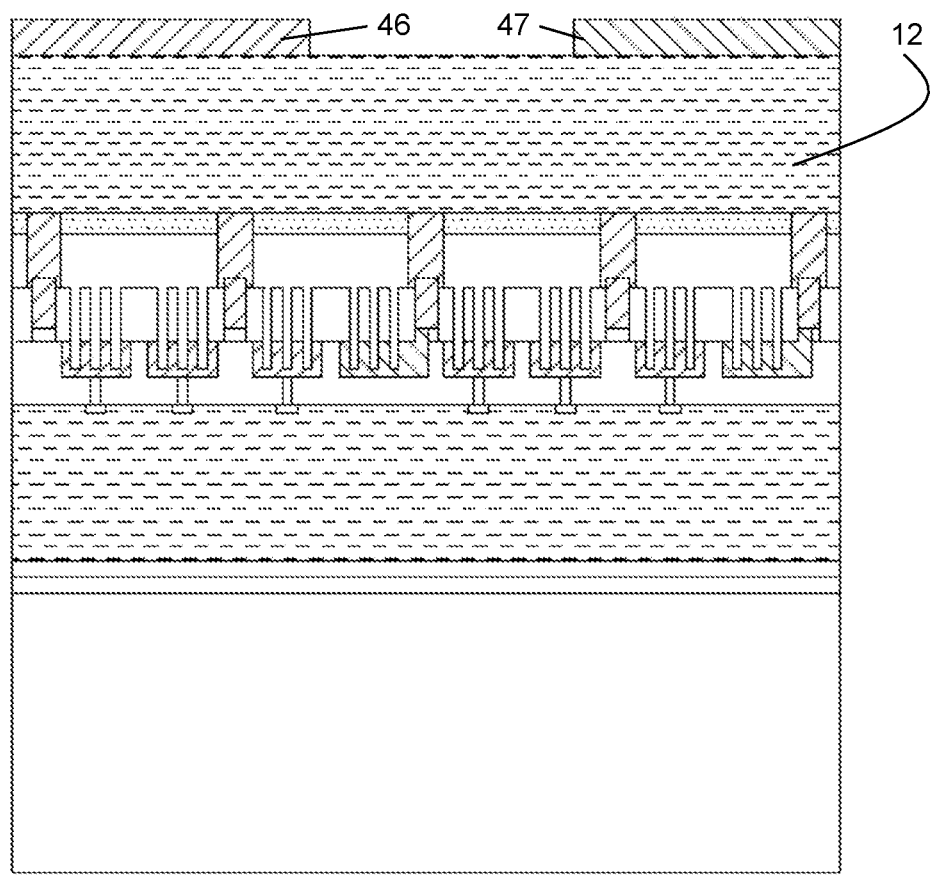

The formation of the TSV openings 43 is followed by the conformal deposition of a dielectric liner (not shown), for example an oxide, on the sidewalls and the bottom of the TSV openings and on the upper surface of the passivation layer. For example, a liner thickness of about 20 nm may be deposited by atomic layer deposition. Then a self-aligned plasma etch may be applied, removing the liner from the bottom of the TSV openings 43 and the upper surface of the passivation layer 42, while maintaining the liner on the sidewalls of the TSV openings. This type of plasma etch is described, for example, in EP Publication No. 3035369A1. Then a diffusion barrier (not shown) is deposited in the TSV openings 43 and the TSV openings are filled with metal 44 (see FIG. 4G), for example tungsten or ruthenium deposited by ALD, followed by a planarization step, thereby removing the barrier and metal from the surface of the passivation layer 42 (see FIG. 4H). In this way, an array of TSV contacts 16/17 is obtained at a tight pitch, similar to the cell-level VDD to VSS spacing, for example about 200 nm. Then a series of damascene process steps are performed for producing a BEOL-type interconnect stack 12 that connects the TSV contacts 16/17 through a low resistive circuit to VDD and VSS terminals 46/47 on the backside of the IC (FIG. 4I). This interconnect stack is the power delivery network 12 of the IC according to the disclosed technology.

Figure 5A:
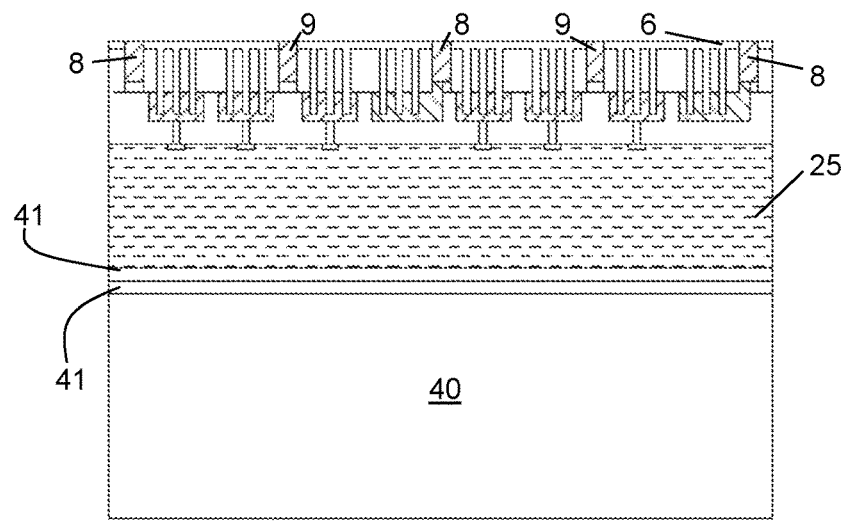
FIGS. 5A through 5C illustrate process steps according to an alternative embodiment for the production of an IC according to the disclosed technology.
Figure 5B:
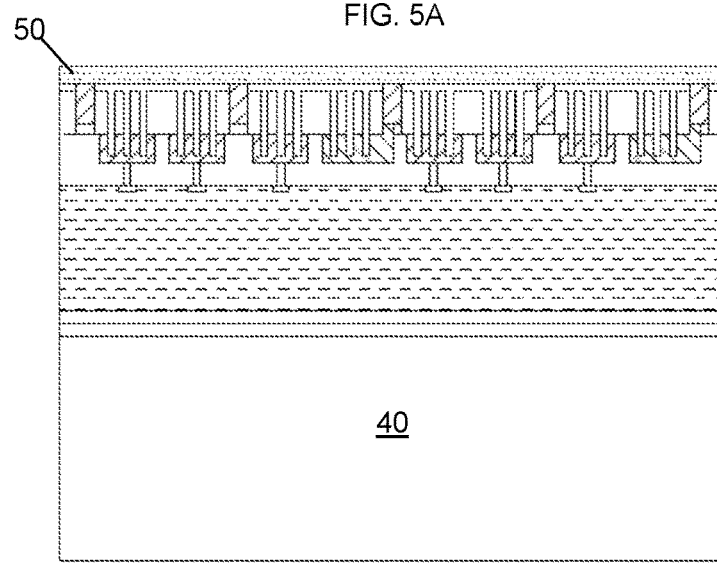
Figure 5C:
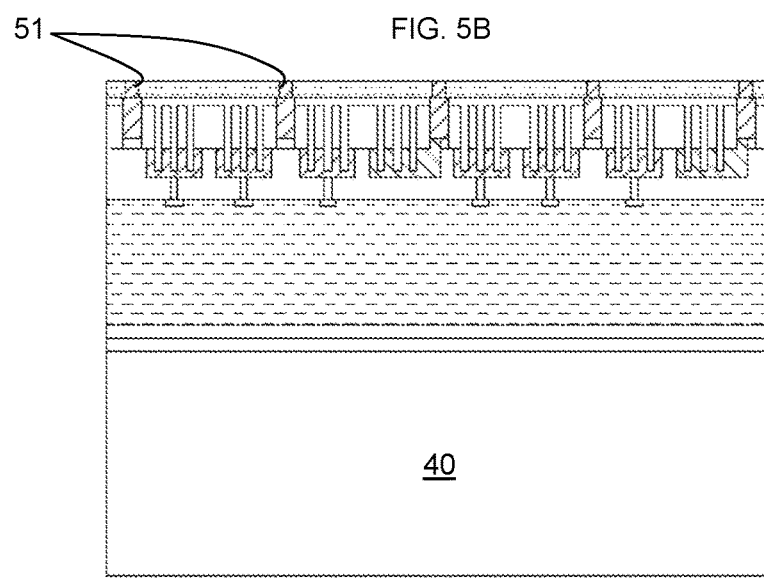

An alternative approach is illustrated in FIGS. 5A through 5C. Instead of leaving about 1 µm of substrate material, this material may be removed by Chemical Mechanical Polishing (CMP), until the interconnect rails 8/9 are exposed (see FIG. 5A). This is followed by the deposition of a passivation layer 50 (see FIG. 5B), and the fabrication of contacts 51 through the passivation layer towards the buried rails 8/9, using a damascene process (see FIG. 5C). The backside PDN is then produced in the same manner as described above. Alternatively, the contacts 51 may be produced in a double damascene process in combination with the first metal level of the PDN.

Figure 6A:
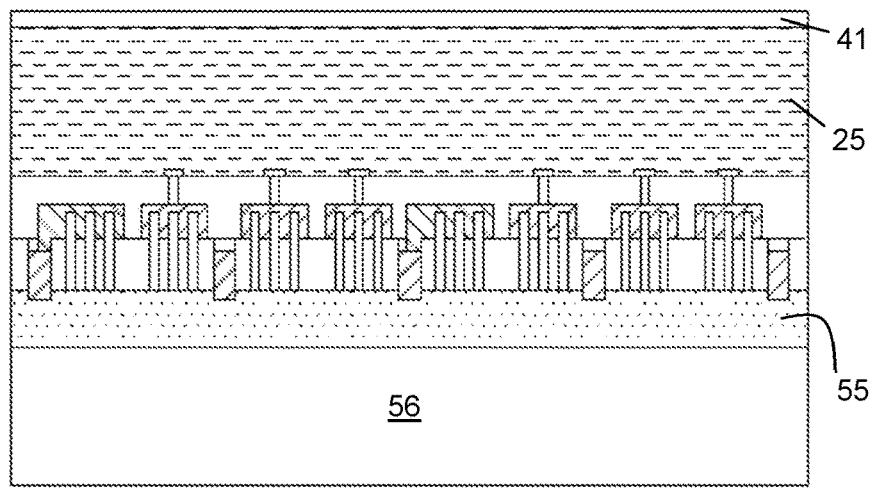
FIGS. 6A through 6D illustrate process steps for producing an IC according to the disclosed technology based on SOI type finFET transistors.
Figure 6A:
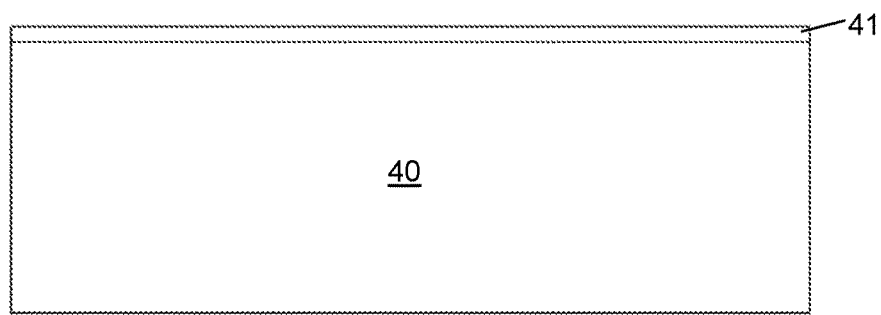
Figure 6B:
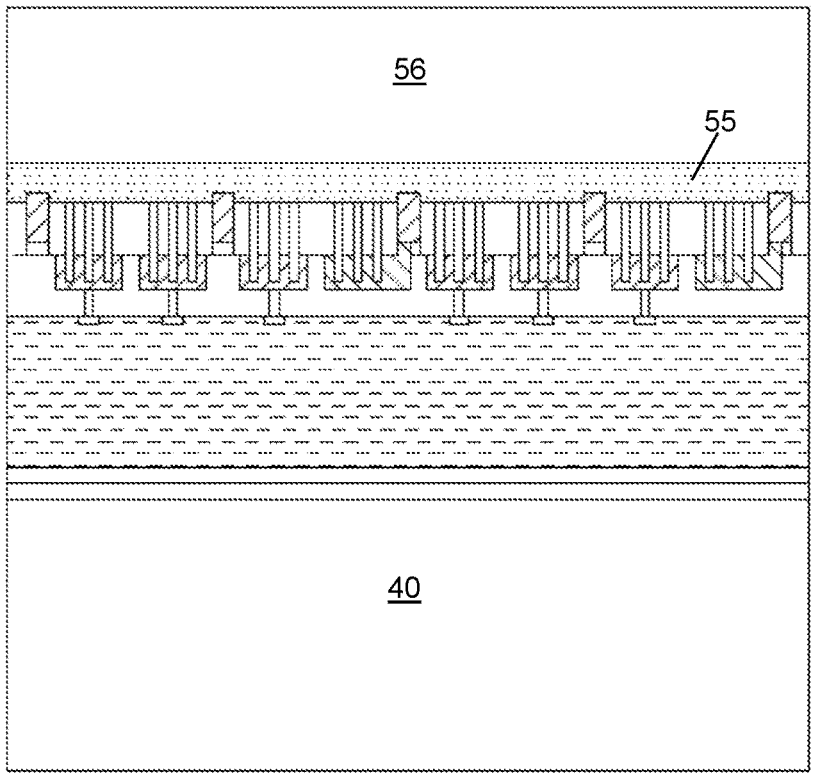
Figure 6C:
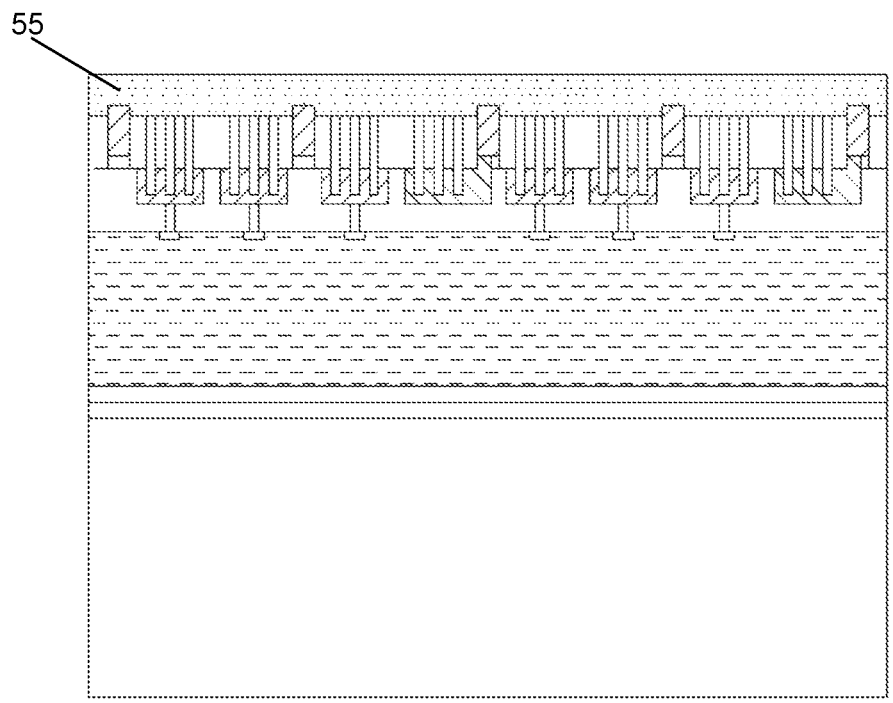
Figure 6D:
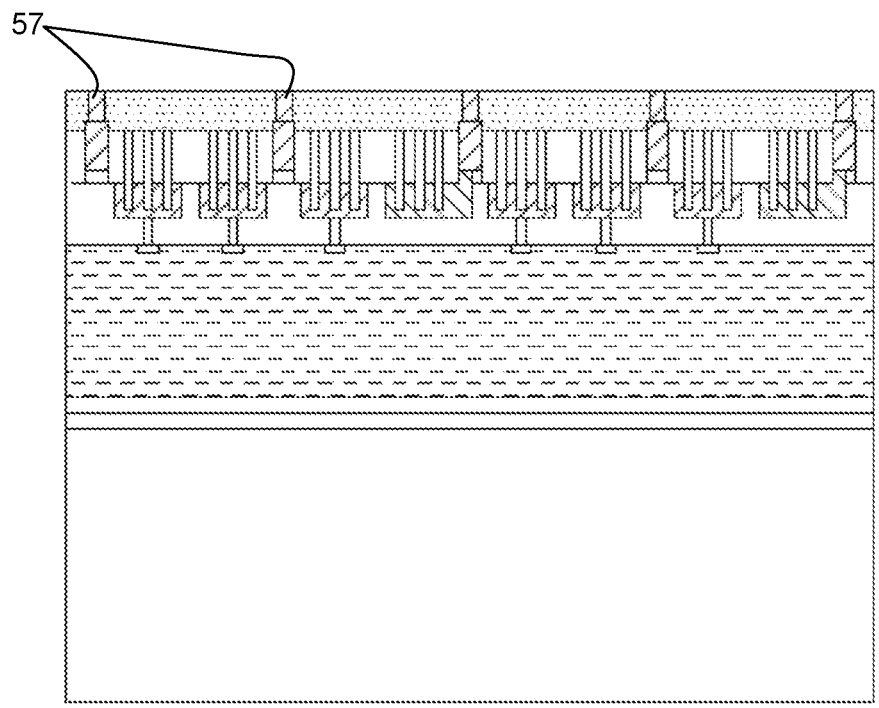
Figure 7:
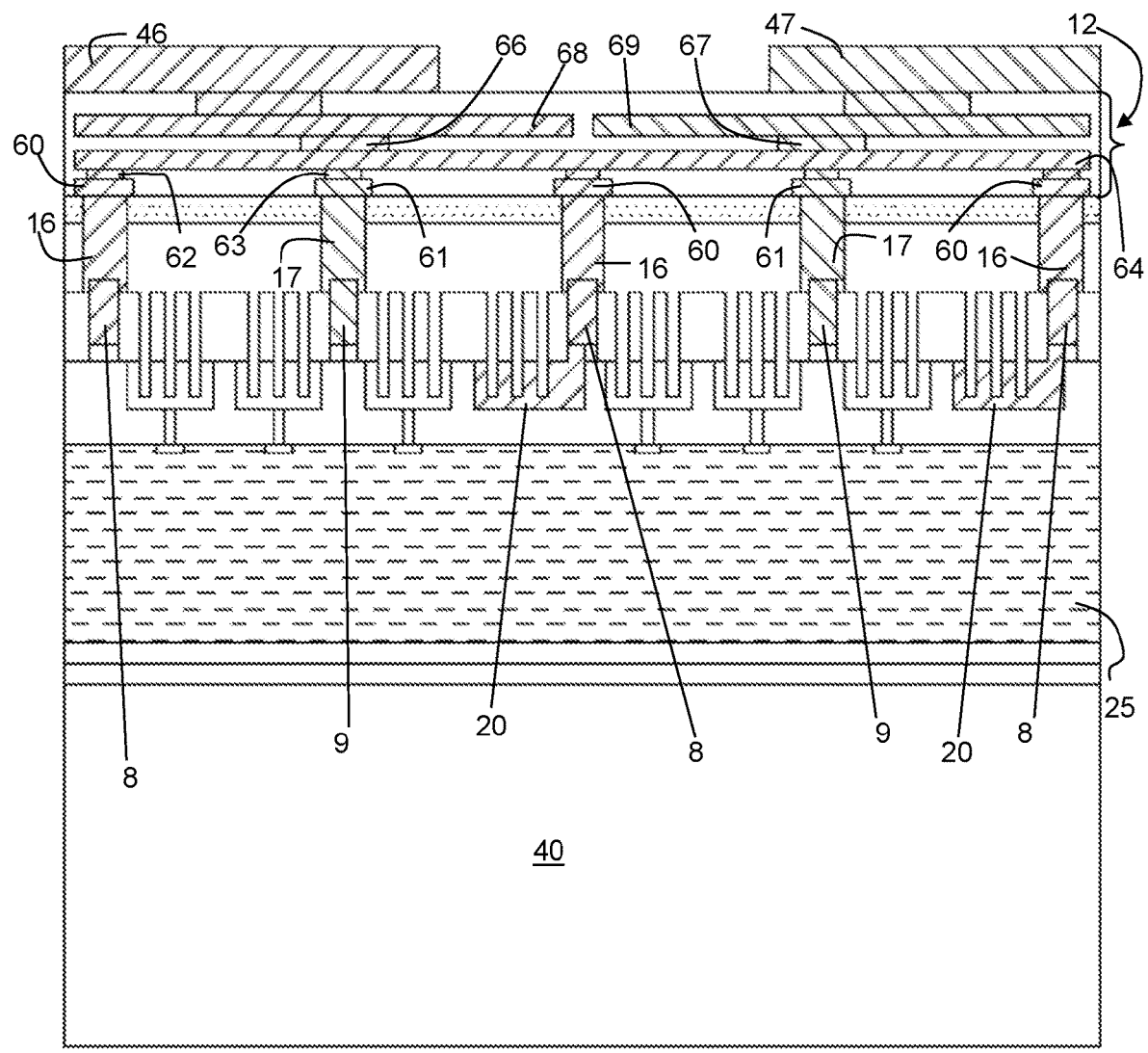
FIG. 7 illustrates how a backside PDN of the disclosed technology may be structured.

According to yet another embodiment, the active devices are built on an insulator layer such as the oxide layer 55 of an SOI substrate (see FIG. 6A), where the device wafer comprises an oxide layer 55 on top of a bulk silicon wafer 56, with the fins 5 produced on top of the oxide layer 55. The buried interconnect rails 8/9 are partly embedded in the oxide layer 55. After bonding the device wafer to the auxiliary substrate 40 in the same manner as described above, through bonding layers 41 (see FIG. 6B), the bulk silicon wafer 56 is removed by etching, stopping on the oxide layer 55 (see FIG. 6C). In some cases, the oxide layer 55 is itself thinned (not shown in drawings). The backside contacts 57 may then be formed in the oxide layer 55 by damascene processing (see FIG. 6D), or by TSV type contacts through the oxide layer 55 followed by the further production of the PDN in the same manner as described above.

Figure 8A:
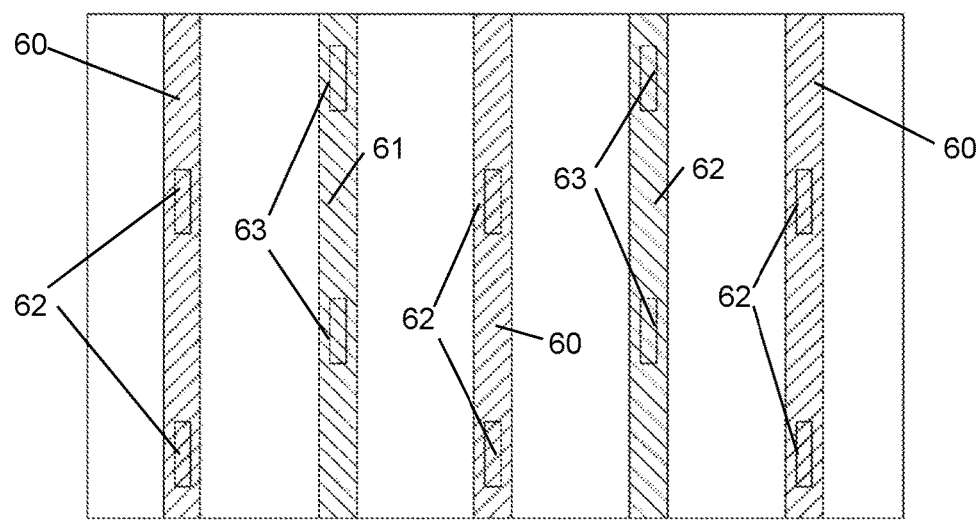
FIGS. 8A through 8D show top views of a number of layers of the PDN shown in FIG. 7.
Figure 8B:
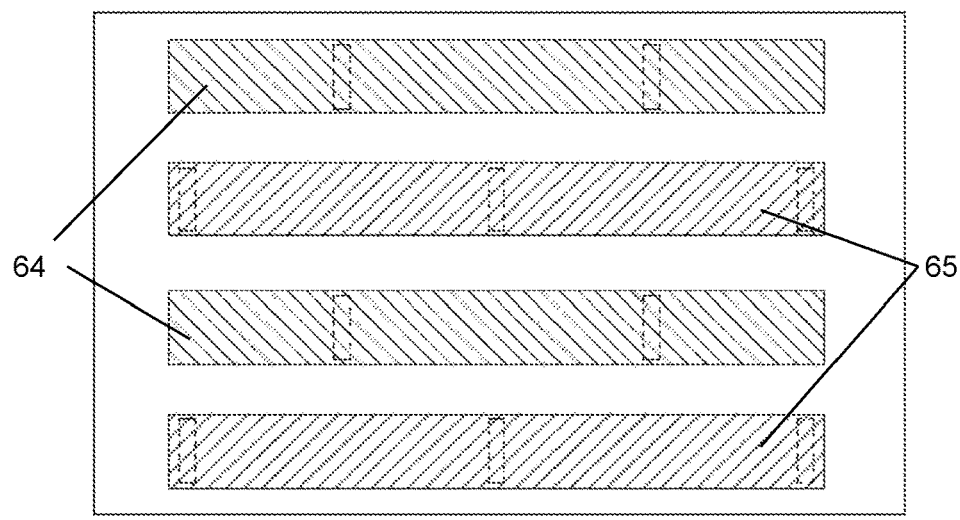
Figure 8C:
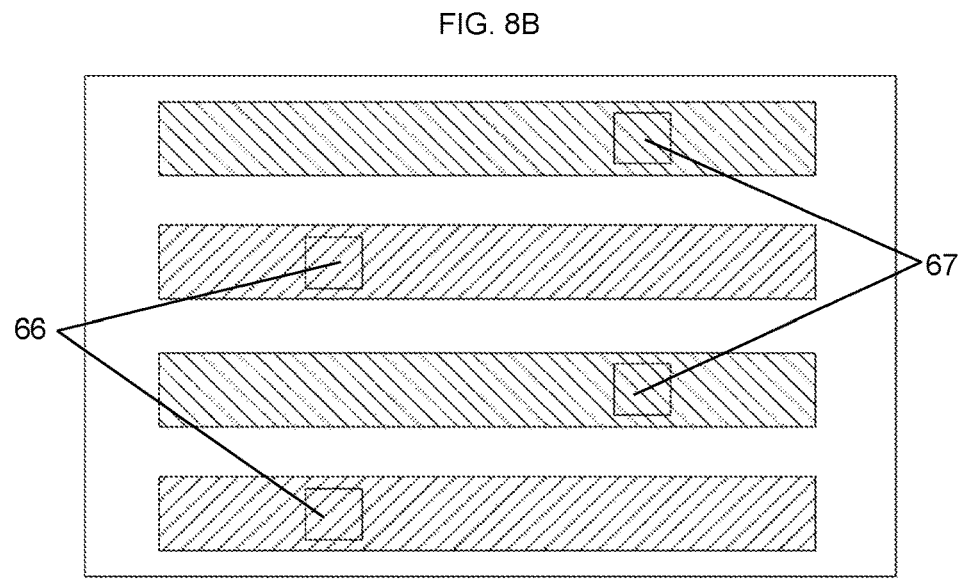
Figure 8D:
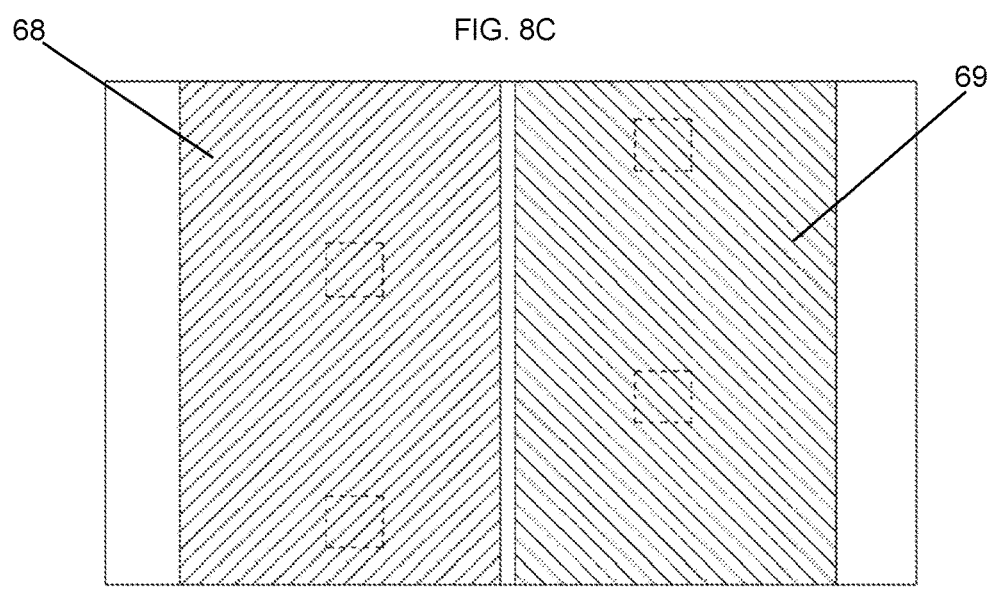

A possible implementation of a backside PDN interconnect stack according to the disclosed technology is shown in FIG. 7 and FIGS. 8A through 8D. This shows how a series of alternate power and ground buried rails 8/9 are contacted via the PDN 12 to power and ground terminals 46/47 on the backside of the IC. The hatching angle indicates whether the lines and vias are connected to power (//) or ground (\\). In a first metal layer of the PDN, parallel line segments 60 and 61 are formed, each line segment being in contact with a TSV-type contact via 16 or 17 and thereby with a buried rail 8 or 9 so that alternate power and ground lines 60/61 are formed in the first metal layer. A top view of a number of these lines 60/61 is shown in FIG. 8A. On top of this, a via layer is produced, including power and ground vias 62/63, the vias being patterned so that rows of power vias 62 and ground vias 63 are formed in the direction perpendicular to the lines 60/61. In the following layer, metal lines 64/65 are formed in this perpendicular direction, interconnecting respectively the power and ground vias 62/63. See FIG. 8B. This is followed by another level of power and ground vias 66/67 and by a top level of one power line 68 and one ground line 69. See FIGS. 8C and 8D. These lines are then contacted by a plurality of power and ground terminals 47/48. The vias and lines are produced by known lithography and etch techniques, preferably by single or double damascene processing.

Figure 9:
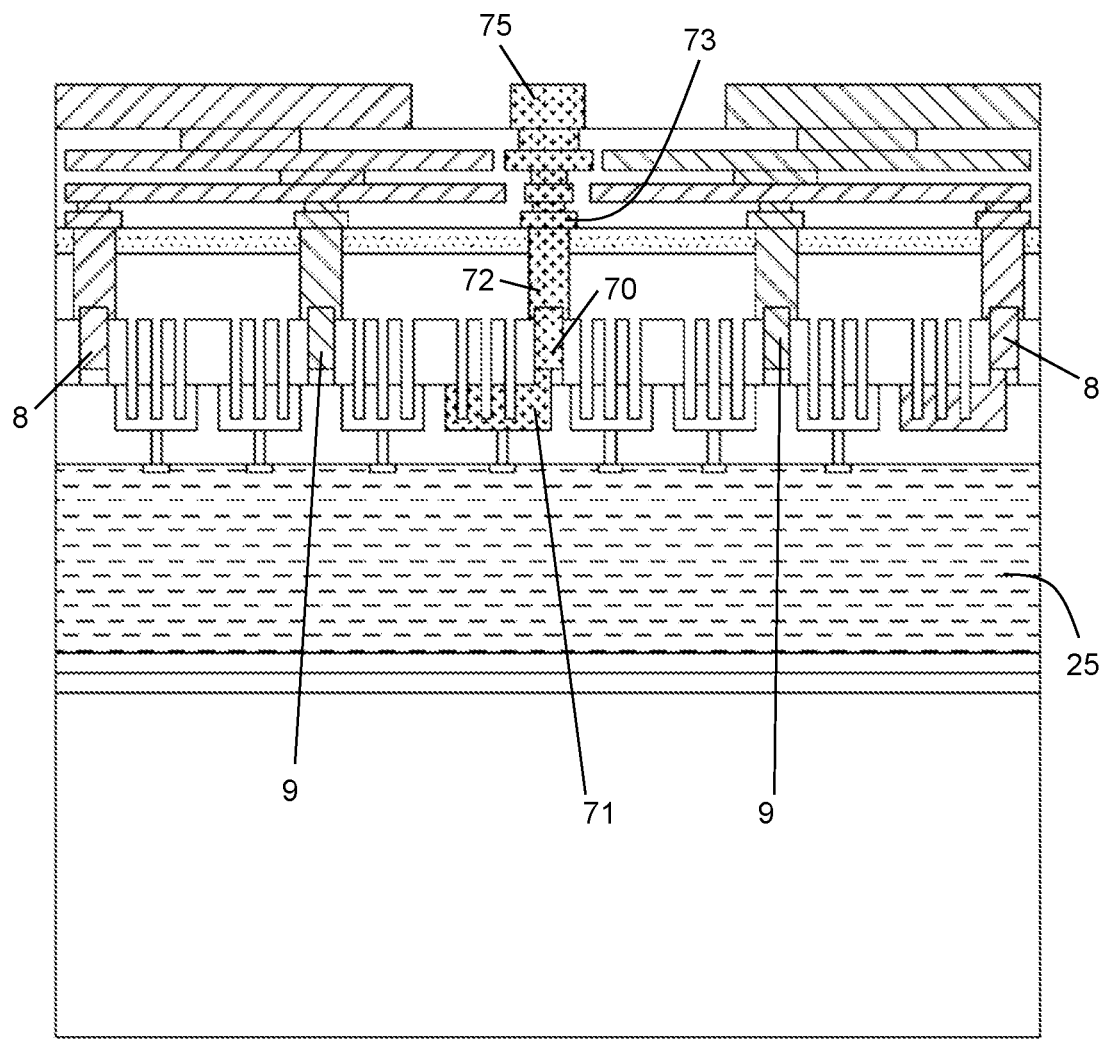
FIG. 9 illustrates how an input or output signal may be brought to the backside of a chip according to the disclosed technology, by making a cut-out in the backside PDN.
Figure 10:
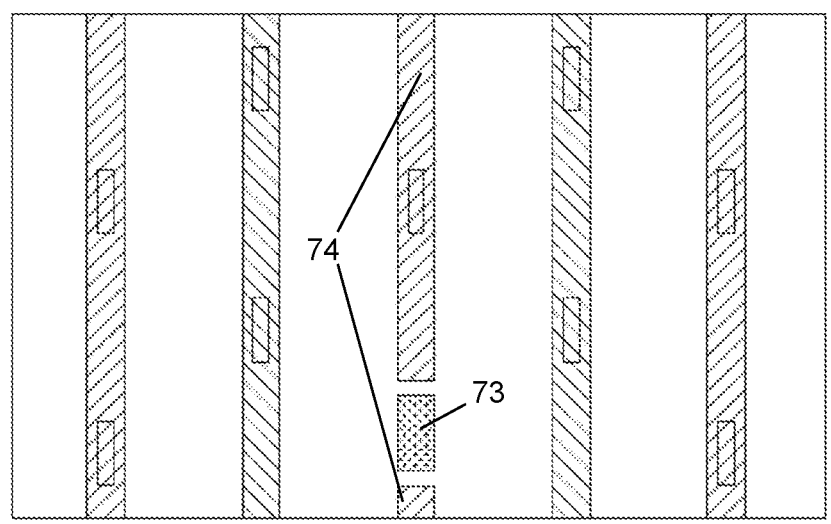
FIG. 10 shows a top view of the first layer of the PDN shown in FIG. 9.

According to an embodiment, I/O signals directed to or coming from the active devices in the FEOL may be routed through cut-outs in the PDN fabric. This is illustrated in FIGS. 9 and 10, with crossed hatching ('+') indicating I/O signal routing, with power and ground connections indicated as before by respective slanted hatching (// and \\ respectively). In this case, a portion 70 of one of the VDD-connected buried rails 8 is isolated from the rest of the rail, and a local interconnect 71 connects this isolated portion to the back end of line 25 of the IC. The isolated portion 70 of the rail is connected through a TSV type contact via 72 to an isolated portion 73 of metal line 74 (see FIG. 10) in the first level of the PDN, and the signal is brought to the back of the chip by subsequent vias and line portions in the different PDN levels, until reaching a signal input or output terminal 75. Where necessary, the power or ground lines of the PDN are interrupted or shifted to accommodate the passage of the signal path. It is also possible that a buried rail 8 or 9 is entirely used for routing I/O signals, i.e., one of the rails 8 or 9 is neither connected to power nor to ground but only to one or more signal inputs or outputs of active devices in the front end of line.

Figure 11:
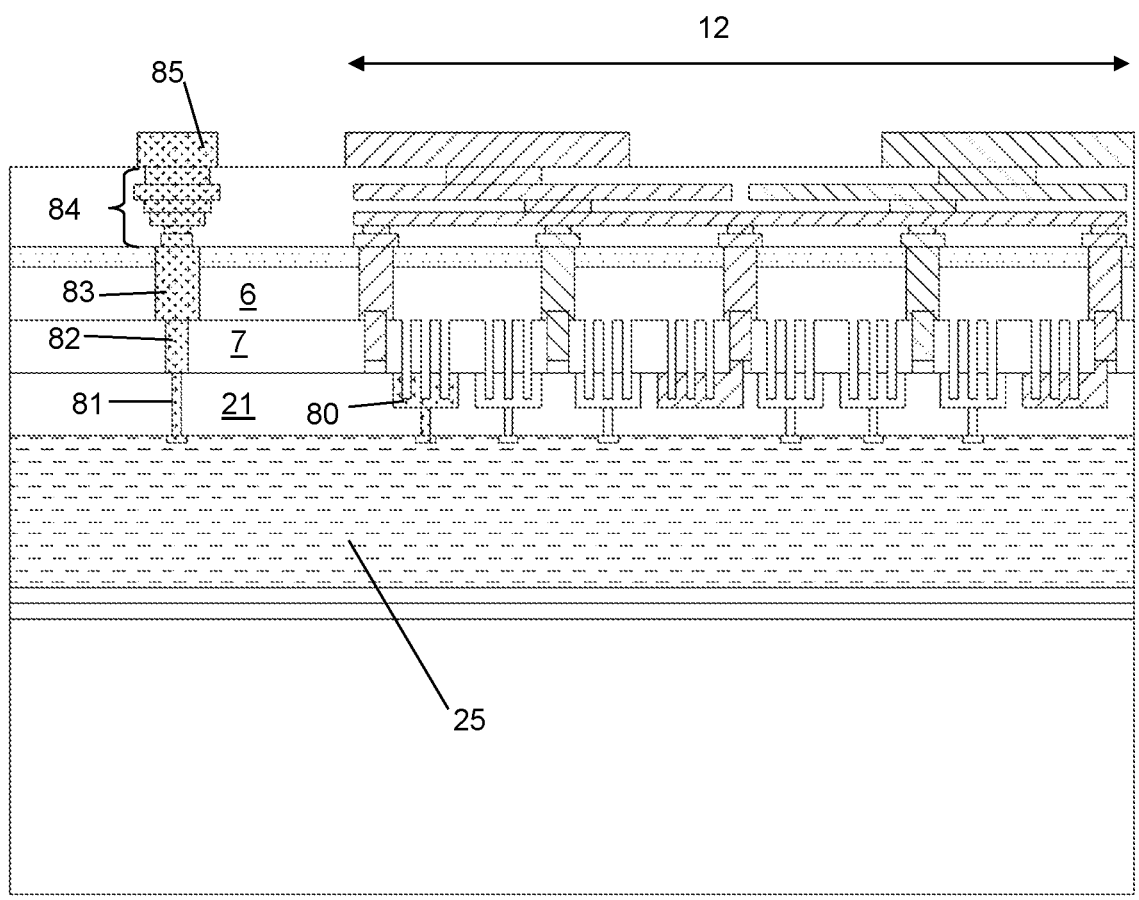
FIG. 11 shows an alternative way of bringing an input or output signal to the backside of the IC.

Signals may also be routed to the back of the chip without cutting through the PDN fabric, as illustrated in FIG. 11. In the example of FIG. 11, the PDN 12 is limited to a particular area of the IC. A local signal contact 80 is connected via the BEOL 25 to a series of via-connections 81, 82, 83 respectively through the pre-metal dielectric 21, the STI oxide 7 and the semiconductor substrate 6, and from there to a signal path 84 formed adjacent to the PDN 19, and ending in an I/O terminal 85.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

Unless specifically specified, the description of a layer or other feature being present, deposited or produced "on" another layer or substrate, includes the options of:
the layer or feature being present, produced or deposited directly on, i.e., in physical contact with, the other layer or substrate; and
the layer or feature being present, produced or deposited on one or a stack of intermediate layers between the layer or feature and the other layer or substrate.

What is claimed is:

1. An integrated circuit (IC) chip comprising:
a front end of line (FEOL) portion comprising active devices;
a pre-metal dielectric layer on top of the front end of line portion;
a back end of line (BEOL) portion on top of the pre-metal dielectric layer;
one or more power terminals and one or more reference terminals; and
a power delivery network (PDN) connecting a plurality of the active devices to the one or more power terminals and the one or more reference terminals, wherein the front end of line portion comprises a plurality of interconnect rails, comprising at least one power rail and at least one reference rail, wherein the power delivery network is connected to the plurality of interconnect rails by metal-filled through-semiconductor vias (TSVs) through the front end of the line portion or by damascene-type contacts, wherein the plurality of active devices are connected to the at least one power and reference rail through local interconnects that are not part of the BEOL portion and which are at least partially embedded in the pre-metal dielectric layer, wherein the power delivery network is entirely located underneath the front end of line portion, and wherein the power delivery network connects the at least one power rail and at least one reference rail, respectively, to the power and reference terminals.

2. The IC chip according to claim 1, wherein the FEOL portion comprises a semiconductor substrate, and wherein the interconnect rails are at least partially buried in the semiconductor substrate.

3. The IC chip according to claim 2, wherein the power delivery network is connected to the interconnect rails by metal-filled through-semiconductor vias (TSVs) through the semiconductor substrate.

4. The IC chip according to claim 1, wherein the FEOL portion comprises a dielectric layer that is itself formed on a semiconductor substrate, wherein the interconnect rails are at least partially buried in the dielectric layer, and wherein the power delivery network is connected to the buried interconnect rails by metal-filled through-semiconductor vias (TSVs) through the dielectric layer or by damascene-type contacts.

5. A method of producing an integrated circuit (IC) chip according to claim 1, the method comprising the consecutive steps of:
producing the FEOL portion, the pre-metal dielectric and the BEOL portion on a first substrate, the FEOL portion comprising a plurality of interconnect rails connected to active devices in the FEOL portion through local interconnects at least partially embedded in the pre-metal dielectric;
bonding the first substrate to an auxiliary substrate with the BEOL portion attached to the auxiliary substrate;
thinning the first substrate;
producing contacts from the back of the thinned substrate, to the interconnect rails in the FEOL portion; and
producing the power delivery network on the back of the thinned substrate.

6. The method according to claim 5, wherein the contacts are produced by etching Trough Semiconductor Via openings through the thinned substrate and filling these via openings with conductive material.

7. The method according to claim 5, wherein the contacts are produced by damascene processing.

8. The method according to claim 5, wherein thinning of the substrate is performed until reaching the back of the interconnect rails.

9. The method according to claim 5, wherein the FEOL portion comprises a dielectric layer that is itself part of the first substrate, and wherein the step of thinning continues at least until reaching the dielectric layer.

10. An integrated circuit (IC) chip comprising:
a front end of line (FEOL) portion comprising active devices;
a pre-metal dielectric layer on top of the front end of line portion;
a back end of line (BEOL) portion on top of the pre-metal dielectric layer;
one or more power terminals and one or more reference terminals; and
a power delivery network (PDN) connecting a plurality of the active devices to the one or more power terminals and the one or more reference terminals, wherein the front end of line portion comprises a plurality of interconnect rails, comprising at least one power rail and at least one reference rail, wherein the plurality of active devices are connected to the at least one power and reference rail through local interconnects that are not part of the back end of the line portion and which are at least partially embedded in the pre-metal dielectric layer, wherein the power delivery network is entirely located underneath the front end of line portion, wherein the power delivery network connects the at least one power rail and the at least one reference rail, respectively, to the power and reference terminals, and wherein a plurality of parallel power rails and reference rails are alternately arranged, and wherein the active devices are located in between pairs of adjacent power and reference rails.

11. The IC chip according to claim 10, wherein the active devices comprise finFET transistors which include fins arranged essentially parallel to the interconnect rails, each of the finFET transistors comprising source and drain areas and a gate electrode, and wherein at least some of the source and drain areas of the transistors are connected to the power and reference rails through the local interconnects.

12. An integrated circuit (IC) chip comprising:
a front end of line (FEOL) portion comprising active devices;
a pre-metal dielectric layer on top of the front end of line portion;
a back end of line (BEOL) portion on top of the pre-metal dielectric layer;
one or more power terminals and one or more reference terminals; and
a power delivery network (PDN) connecting a plurality of the active devices to the one or more power terminals and the one or more reference terminals, wherein the front end of line portion comprises a plurality of interconnect rails, comprising at least one power rail and at least one reference rail, wherein the plurality of active devices are connected to the at least one power and reference rail through local interconnects that are not part of the back end of the line portion and which are at least partially embedded in the pre-metal dielectric layer, wherein the power delivery network is entirely located underneath the front end of line portion, wherein the power delivery network connects the at least one power rail and the at least one reference rail, respectively, to the power and reference terminals, and wherein a signal path is routed through the power delivery network, between the BEOL portion and a signal terminal.

13. The IC according to claim 12, wherein the signal path comprises a further local interconnect at least partially embedded in the pre-metal dielectric layer and connected between the BEOL portion and a portion of an interconnect rail that is isolated from the rest of the rail.

14. The IC chip according to claim 12, wherein the FEOL portion further comprises at least one interconnect rail that is:
not connected to the power and reference terminals; and
a part of the signal path and connected to the BEOL portion, via one or more additional local interconnects which are at least partially embedded in the pre-metal dielectric layer.

15. An integrated circuit (IC) chip comprising:
a front end of line (FEOL) portion comprising
active devices comprising a plurality of source drain areas, and
a plurality of laterally extending interconnect rails, comprising at least one power rail and at least one reference rail;
a pre-metal dielectric layer formed over the front end of line portion;
a back end of line (BEOL) portion formed over the pre-metal dielectric layer;
local interconnects providing a lateral connection between the plurality of source drain areas and the plurality of interconnect rails in the front end of line portion, wherein the local interconnects are not part of the back end of line portion and are at least partially embedded in the pre-metal dielectric layer;
one or more power terminals and one or more reference terminals; and
a power delivery network (PDN) connecting a plurality of the active devices to the one or more power terminals and the one or more reference terminals, wherein the power delivery network is entirely located underneath the front end of line portion and connects the at least one power rail and the at least one reference rail, respectively, to the power and reference terminals.

16. The IC chip according to claim 15, wherein the plurality of active devices comprise finFET transistors which include fins, and wherein the local interconnects are arranged tranversely to the fins.

17. The IC chip according to claim 15, wherein the local interconnects contact a top of the at least one power rail and the at least one reference rail.

18. The IC chip according to claim 15, wherein the local interconnects are formed of a different material than the at least one power rail and the at least one reference rail.

19. The IC chip according to claim 18, wherein the local interconnects are formed of a material comprising a metal and the at least one power rail and the at least one reference rail are formed of a material comprising doped silicon.

20. The IC chip according to claim 15, wherein the at least one power rail and the at least one reference rail run along parallel tracks transverse to the local interconnects.

* * * * *